(12) United States Patent
Kawashima et al.

(10) Patent No.: US 7,566,920 B2
(45) Date of Patent: Jul. 28, 2009

(54) BIPOLAR TRANSISTOR AND POWER AMPLIFIER

(75) Inventors: Katsuhiko Kawashima, Hyogo (JP); Masahiro Maeda, Osaka (JP); Keiichi Murayama, Toyama (JP); Hirotaka Miyamoto, Toyama (JP)

(73) Assignee: Panasonic Corporation, Osaka (JP)

( * ) Notice: Subject to any disclaimer, the term of this patent is extended or adjusted under 35 U.S.C. 154(b) by 35 days.

(21) Appl. No.: 11/484,753

(22) Filed: Jul. 12, 2006

(65) Prior Publication Data

US 2007/0012949 A1    Jan. 18, 2007

(30) Foreign Application Priority Data

Jul. 13, 2005   (JP) .............................. 2005-204606
Jul. 29, 2005   (JP) .............................. 2005-221213

(51) Int. Cl.
 *H01L 29/737* (2006.01)
(52) U.S. Cl. ............................... 257/197; 257/E29.188
(58) Field of Classification Search ................ 257/192, 257/197, 198, 511, 565, 566, E29.174, E29.188
See application file for complete search history.

(56) References Cited

U.S. PATENT DOCUMENTS

| | | | |
|---|---|---|---|
| 4,151,009 A | * | 4/1979 | Ogureck et al. ............. 438/309 |
| 5,036,016 A | * | 7/1991 | Drosd ......................... 438/362 |
| 5,608,353 A | | 3/1997 | Pratt |
| 5,629,648 A | | 5/1997 | Pratt |
| 6,448,859 B2 | * | 9/2002 | Morizuka ..................... 330/295 |
| 2001/0010388 A1 | * | 8/2001 | Yanagihara et al. ......... 257/565 |
| 2001/0052820 A1 | | 12/2001 | Morizuka |
| 2005/0116319 A1 | * | 6/2005 | Twynam ...................... 257/565 |

FOREIGN PATENT DOCUMENTS

| | | |
|---|---|---|
| CN | 1318898 A | 10/2001 |
| JP | 06-342803 A | 12/1994 |
| JP | 07-202168 * | 8/1995 |
| JP | 2001-196865 A | 7/2001 |
| JP | 2002-110904 A | 4/2002 |

OTHER PUBLICATIONS

Chinese Office Action issued in Chinese Patent Application No. CN 2006101015669, dated Mar. 13, 2009.

* cited by examiner

*Primary Examiner*—Sue Purvis
*Assistant Examiner*—Kevin Quinto
(74) *Attorney, Agent, or Firm*—McDermott Will & Emery LLP

(57) ABSTRACT

A base mesa finger (an emitter ledge layer 15, a base layer 16, and a collector layer 17) is interposed between two collector fingers (collector electrodes 13), and on the base mesa finger, a base finger (a base electrode 12) and two emitter fingers (an emitter layer 14 and an emitter electrode 11) on both sides of the base finger, are formed. The two emitter fingers are formed symmetric with respect to the base finger as a reference.

1 Claim, 12 Drawing Sheets

FIG. 1 1 A  PRIOR ART
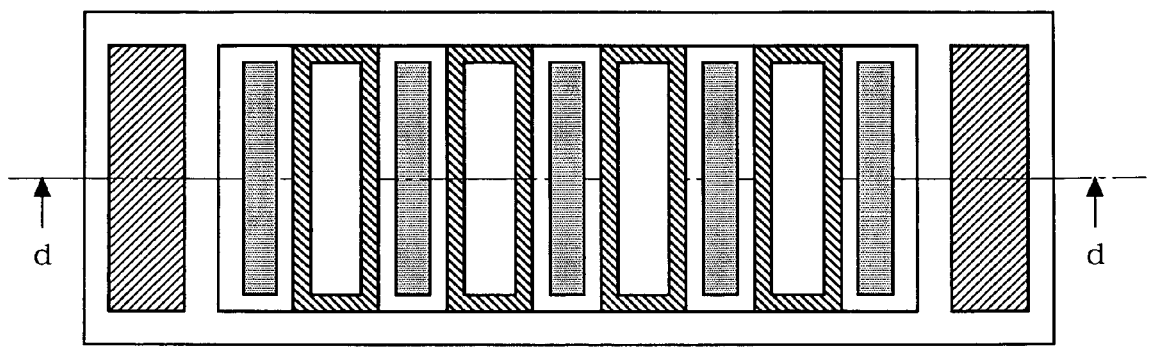
FIG. 1 1 B  PRIOR ART
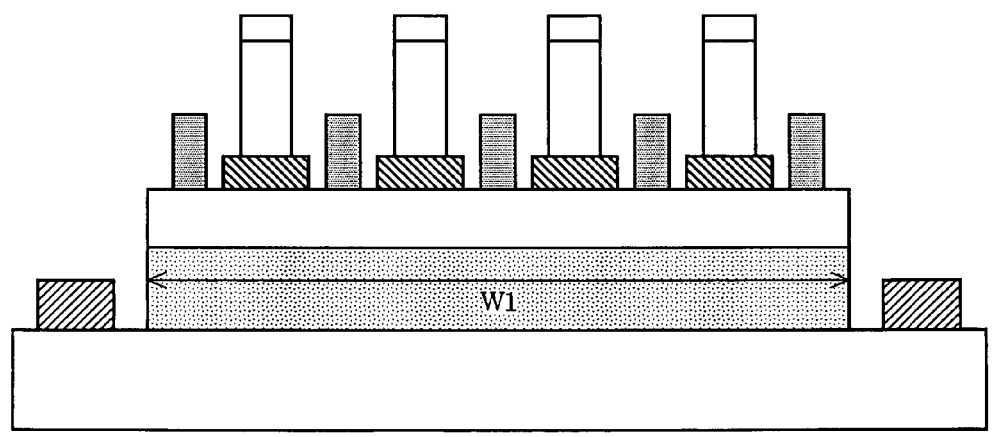

FIG. 1 2 A   PRIOR ART
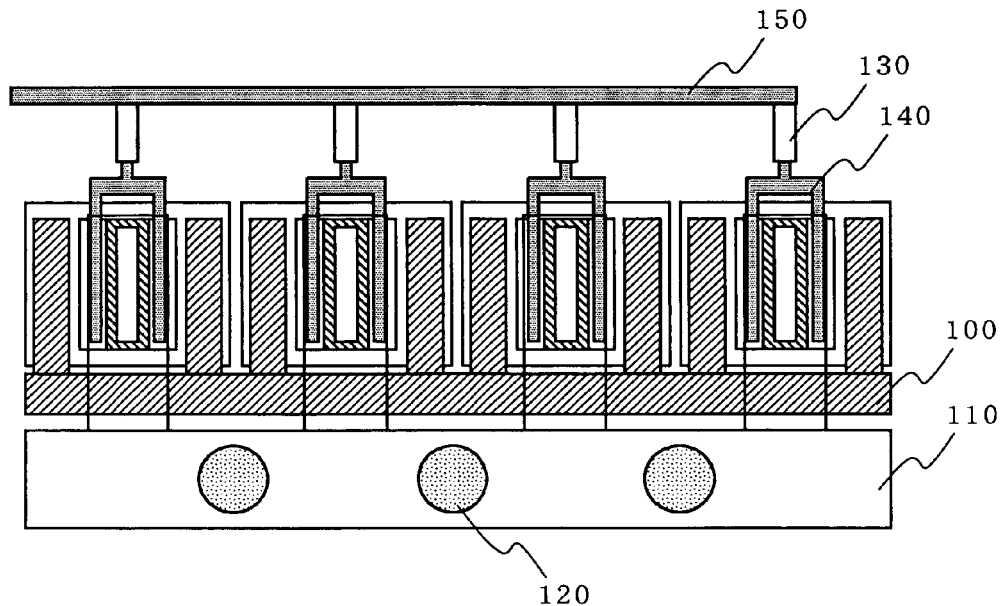
FIG. 1 2 B   PRIOR ART
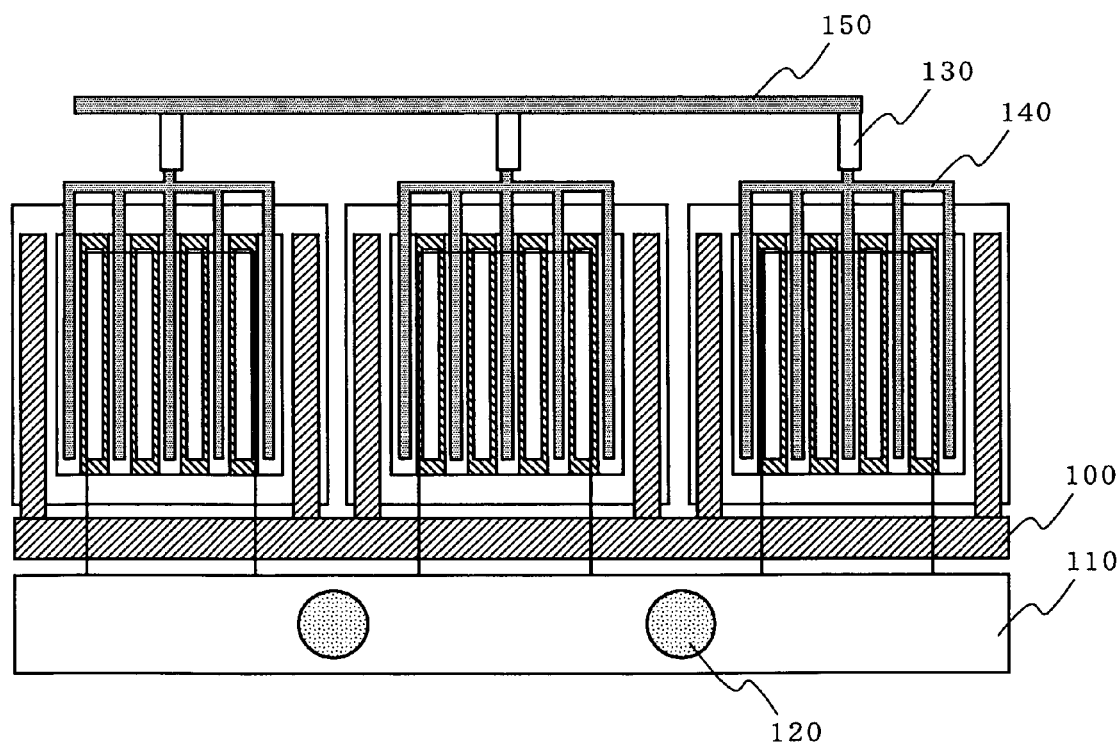

BIPOLAR TRANSISTOR AND POWER AMPLIFIER

BACKGROUND OF THE INVENTION

1. Field of the Invention

The present invention relates to a bipolar transistor and a power amplifier. More particularly, the present invention relates to a bipolar transistor which is formed as an active element on a semiconductor integrated circuit for power amplification which is used in a signal transmitting section of a mobile radio terminal (a mobile telephone, etc.) which uses a radio frequency band, and a power amplifier employing the bipolar transistor.

2. Description of the Background Art

In recent years, a semiconductor integrated circuit for power amplification which employs, as an active element, a bipolar transistor made of a compound semiconductor which enables a radio frequency operation and a positive power supply operation, is widely used in a signal transmitting section of a mobile radio terminal, such as a mobile telephone or the like. Particularly, a heterojunction bipolar transistor (hereinafter abbreviated as HBT) is widely used in which a base layer thereof is a p type GaAs layer, and an emitter layer thereof in a heterojunction with the base layer is an AlGaAs or InGaP layer having a large band gap. The reason why the HBT is adopted among bipolar transistors is that holes of the base layer can be prevented from flowing backward into the emitter layer and recombining with electron carriers of the emitter, thereby increasing the efficiency of injection of electron carriers from the emitter to the base, resulting in a high-efficiency operation of the transistor.

The HBT generally has a multi-finger structure in which one or a plurality of stripline-type emitter fingers are arranged side by side. See, for example, Japanese Patent Laid-Open Publication No. 6-342803 and Japanese Patent Laid-Open Publication No. 2002-110904. FIGS. 10A and 10B are a plan view and a cross-sectional view illustrating an exemplary HBT structure in which one emitter finger is provided. In the structure of the conventional HBT of FIGS. 10A and 10B, one emitter finger (an emitter layer 104 and an emitter electrode 101) and two base fingers (base electrodes 102) provided on both sides of the emitter finger, are interposed between two collector fingers (collector electrodes 103). Typically, an output power of the HBT is determined, depending on an area of the emitter. Therefore, in the case of the HBT having one emitter finger, a length L of the emitter finger needs to be large so as to achieve a high output power. However, the emitter finger needlessly occupies a semiconductor chip area.

To avoid this, a plurality of emitter fingers are provided so as to achieve a high output power of the HBT without increasing the emitter finger length L. FIGS. 11A and 11B are a plan view and a cross-sectional view illustrating an exemplary HBT structure in which four emitter fingers are provided. In the structure of the conventional HBT of FIGS. 11A and 11B, four emitter fingers and five base fingers provided on both sides of the emitter fingers, are interposed between two collector fingers. In the case of the HBT of FIG. 11A, since the emitter area can be occupied by the plurality of emitter fingers, a high-output power HBT can be achieved using the emitter fingers each having a length L smaller than that of the HBT of FIG. 10A.

A multi-cell structure in which the multi-finger structure HBT having excellent radio frequency characteristics is considered as a unit cell and a plurality of the HBT cells are connected in parallel to combine outputs thereof, is widely used as a power-amplification HBT structure. Exemplary power-amplification HBTs having the multi-cell structure are illustrated in FIGS. 12A and 12B. FIG. 12A illustrates an exemplary multi-cell structure in which a plurality of HBT cells each having one emitter finger are provided. FIG. 12B illustrates a multi-cell structure in which a plurality of HBT cells each having four emitter fingers are provided. In FIGS. 12A and 12B, the collector outputs of the HBT cells are collectively connected to a common collector conductor 100, and the emitters of the HBT cells are collectively connected to a common emitter conductor 110. The emitter conductor 110 is provided with a via hole 120 and is grounded via the via hole 120.

However, in the case of such a multi-cell structure, the following points should be noted. In the power-amplification HBT, each HBT cell generates heat due to high current density. However, the HBT cells do not uniformly generate heat, so that a failure occurs in the operation of the HBT cell due to non-uniformity of heat generation between each HBT cell. More specifically, the HBT cell having a temperature higher than the surrounding having a high increase in temperature further generates heat due to positive feedback (thermal runaway), finally leading to breakdown. Also, when heat generation is not uniform between each HBT cell, none of the HBT emitters effectively functions, resulting in a deterioration in radio frequency characteristics.

Therefore, in order to correct the non-uniformity of heat generation between each HBT cell, a method of inserting an external base resistance 130 between a DC bias supply line 150 for supplying a DC bias to each HBT cell and a base conductor 140 of each HBT cell, is employed as clearly illustrated in FIGS. 12A and 12B. By insertion of the external base resistance 130, an increase in base current of the HBT can be suppressed, thereby making it possible to avoid thermal runaway even if temperature increases. The external base resistance 130 is used to stabilize an operation of the HBT cell, and is generally called a base ballast resistance. Note that, by providing a ballast resistance to the emitter of each HBT cell, an increase in collector current is also suppressed, thereby making it possible to avoid thermal runaway. However, recently, a base ballast resistance is used more often than a collector ballast resistance is, in view of the narrowness of a value range within which the ballast resistance can take.

As described above, the conventional power-amplification HBT employing a base ballast resistance takes measures against the non-uniformity of heat generation between each HBT cell, however, the non-uniformity of heat generation in each HBT cell is not taken into consideration. The non-uniformity of heat generation in each HBT cell refers to the non-uniformity of heat generation between each emitter finger, which occurs due to the following cause.

In the HBT cell having four emitter fingers of FIG. 11A, when all of the emitter fingers generate almost the same amount of heat, two central emitter fingers are affected by heat from two outer emitter fingers, so that the two central emitter fingers have a higher temperature. Specifically, heat generation distribution regions of the two central emitter fingers overlap heat generation distribution regions of the two outer emitter fingers, so that the two central emitter fingers have a higher temperature (see FIG. 13). Note that, in order to correct the problem, it is considered to provide a sufficient interval between each emitter finger to completely separate the heat generation distribution regions from each other. In this case, however, the area of the HBT cell is increased, resulting in newly arising problems: an increase in chip area; a deterioration in radio frequency characteristics; and the like. Therefore, it is not practical.

In the case of the HBT cell of FIG. 11A, since the five base fingers are provided on both the sides of the four emitter fingers, non-uniformity is likely to occur between each finger in terms of a contact resistance of the base electrode and the base layer of each base finger. Therefore, non-uniformity occurs in the injection amount of a base current, resulting in non-uniformity between each emitter finger.

This problem similarly exists in the HBT cell having one emitter finger and two base fingers of FIG. 10A. Specifically, non-uniformity is likely to occur between the two base fingers in terms of a contact resistance of the base electrode and the base layer of the two base fingers. Particularly, in this HBT cell, the base finger is long, corresponding to the emitter finger, so that the non-uniformity of the contact resistance increases in the length direction. Due to non-uniformity of the base resistances of both the sides, non-uniformity in the operation of the HBT cell increases. For example, a current flowing through the emitter finger is larger in a portion closer to the right base finger than in a portion closer to the left base finger.

Further, in the HBT cell, a base-collector parasitic capacitance is high, and power feedback due to the parasitic capacitance causes a gain deterioration in radio frequency band applications. The radio frequency characteristics of the HBT are determined, mainly depending on a parasitic capacitance occurring between the base layer and the collector layer, and the parasitic capacitance is proportional to a base mesa width W1 illustrated in FIGS. 10B and 11B. This is because the base-collector capacitance is proportional to areas between the base layers sandwiching the collector layer, and the collector layer. In order to reduce the base mesa width W1, it is necessary to reduce areas other than a required emitter area to the extent possible. However, the HBT cell structure of FIG. 11B has five bases for four emitters and the HBT cell structure of FIG. 10B has two bases for one emitter, i.e., the base area is invariably larger by an area corresponding to one base electrode than the required emitter area. Thus, in the conventional HBT cell structure, there is a limitation on the reduction of the base mesa width W1 due to the influence of the base finger, resulting in a deterioration in gain characteristics in a radio frequency band.

On the other hand, in the power-amplification HBT having the multi-cell structure, the value of the external base resistance 130 is large as illustrated in FIGS. 12A and 12B. Therefore, when the power-amplification HBT is actually integrated on a semiconductor, a large area needs to be secured for an external base resistance, resulting in a large chip area, i.e., an increase in cost.

SUMMARY OF THE INVENTION

Therefore, an object of the present invention is to provide a bipolar transistor which has uniform heat generation in an HBT cell and improves gain characteristics in a radio frequency band, and a power amplifier which employs a multi-cell structure to reduce a chip area.

The present invention is directed to a bipolar transistor formed on a semiconductor substrate. To achieve the object, a bipolar transistor of the present invention comprises a base finger, two emitter fingers disposed symmetric with respect to the base finger as a center, and in parallel with the base finger, and two collector fingers disposed sandwiching the base finger and the two emitter fingers. Note that an even number of emitter fingers may be disposed symmetric with respect to the base finger as a center and longitudinally disposed in parallel with the base finger.

Preferably, the two emitter fingers each have a length of 30 μm or less. Also, preferably, the base finger has an electrode width of 1 μm or less.

When the bipolar transistor is a heterojunction bipolar transistor having an emitter layer which is in a heterojunction with the base layer, the base finger can have an electrode having a structure in which the electrode penetrates through a wide gap layer of the emitter layer to ohmically join the base layer.

In addition, a power amplifier can be provided which comprises a plurality of the bipolar transistors, wherein bases thereof are connected in common, collectors thereof are connected to a radio frequency signal output terminal, and emitters are grounded, a capacitance inserted between the radio frequency signal input terminal and the bases connected in common, and a resistance inserted between a bias supply terminal and the bases connected in common.

According to the present invention, a uniform operation in a cell is excellent, and a base-collector capacitance can be reduced, thereby obtaining excellent radio frequency characteristics with low cost. In addition, since an internal base resistance value is high, when a power amplifier having a multi-cell structure is configured, a power amplifier having a small size and an excellent breakdown withstanding property without an external base resistance can be achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11A is a plan view illustrating a structure of another conventional bipolar transistor;

FIG. 11B is a cross-sectional view illustrating the bipolar transistor, taken along line d-d in FIG. 11A.

FIG. 12A is a diagram illustrating an exemplary configuration of a conventional power-amplification HBT having a multi-cell structure where each cell is the bipolar transistor of FIG. 10A;

FIG. 12B is a diagram illustrating an exemplary configuration of a conventional power-amplification HBT having a multi-cell structure where each cell is the bipolar transistor of FIG. 11A.

DESCRIPTION OF THE PREFERRED EMBODIMENTS (Structure of Bipolar Transistor)

Initially, a structure of a bipolar transistor according to an embodiment of the present invention will be described.

Figure 1:
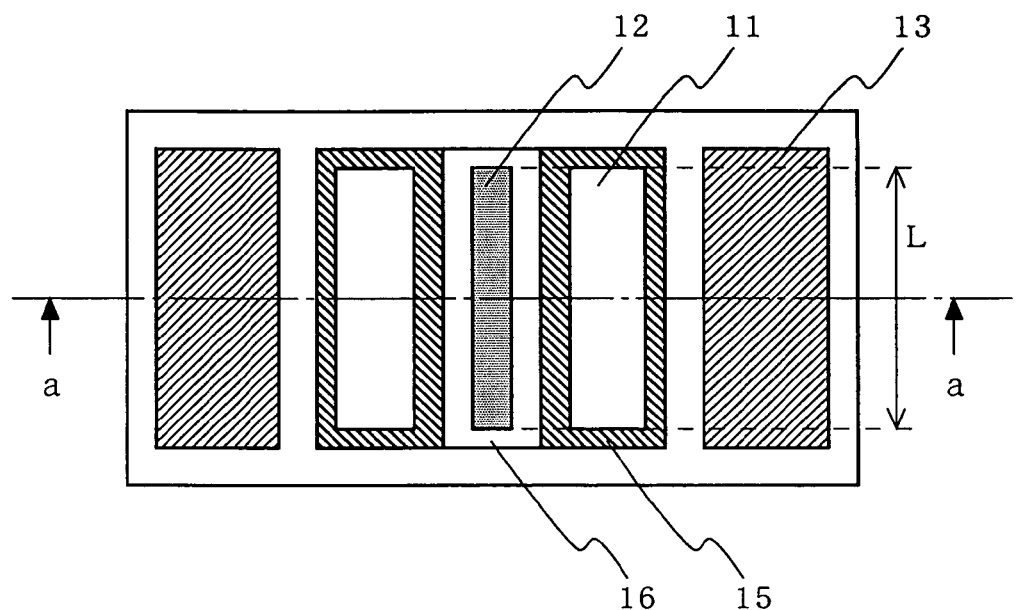
FIG. 1A is a plan view illustrating a structure of a bipolar transistor according to an embodiment of the present invention.
FIG. 1B is a cross-sectional view illustrating the bipolar transistor, taken along line a-a in FIG. 1A.
Figure 1:
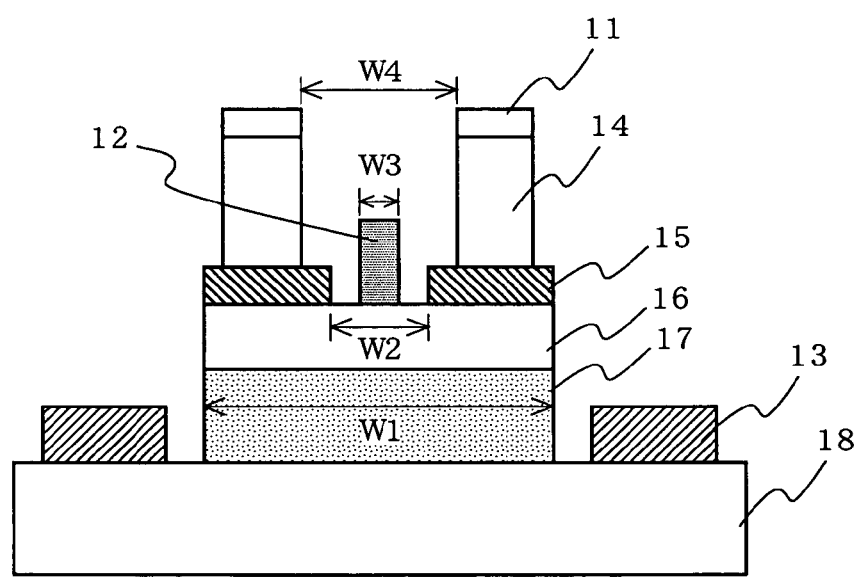

FIG. 1A is a plan view illustrating the structure of the bipolar transistor according to the embodiment of the present invention. FIG. 1B is a cross-sectional view illustrating the bipolar transistor, taken along line a-a in FIG. 1A. In the structure of the bipolar transistor of this embodiment, a base mesa finger (an emitter ledge layer 15, a base layer 16, and a collector layer 17) is interposed between two collector fingers (collector electrodes 13), and one base finger (a base electrode 12) and two emitter fingers (an emitter layer 14 and an emitter electrode 11) on both sides of the base finger, are formed on the base mesa finger. The two emitter fingers are formed at locations symmetric with respect to the base finger as a reference. This bipolar transistor is typically a heterojunction bipolar transistor (HBT).

Figure 2:
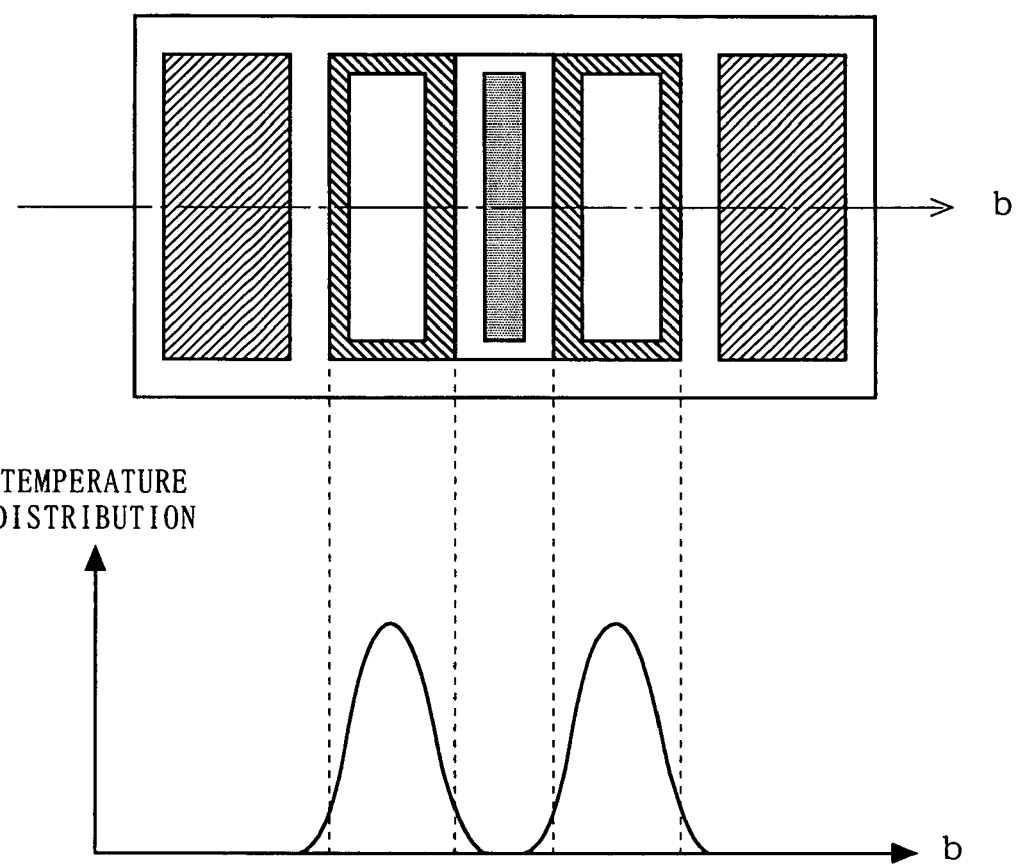
FIG. 2 is a diagram illustrating a unit cell temperature distribution of the bipolar transistor of FIG. 1A.

In the structure of the bipolar transistor of this embodiment, since the two emitter fingers are provided at locations symmetric with respect to the base finger, the two emitter fingers have a uniform head generation as illustrated in FIG. 2. Since there is only one base finger, the non-uniformity problem with base fingers does not occur.

Figure 3:
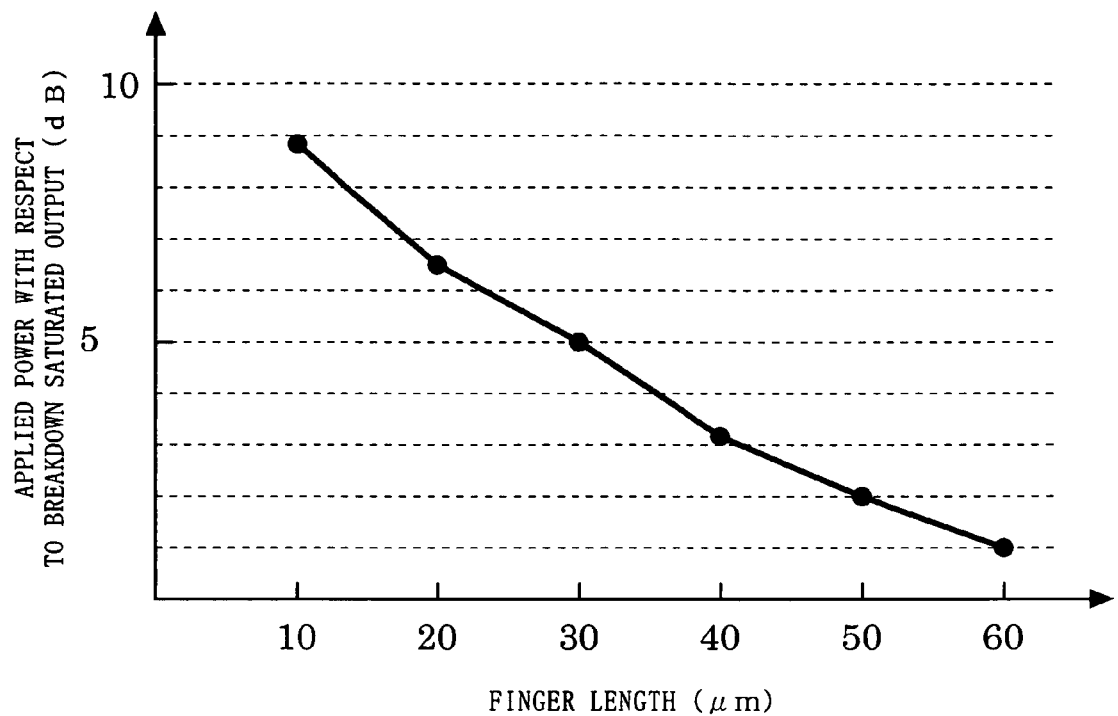
FIG. 3 is a characteristics diagram illustrating a correlation between an emitter finger length and a breakdown withstanding property.

The emitter finger preferably has a length L of 30 μm or less so as to prevent occurrence of non-uniformity. For example, as illustrated in FIG. 3, characteristics of an applied power with respect to a saturated output which breaks one HBT cell due to thermal runaway where the HBT has an output load VSWR=10:1, are considered as an indicator indicating non-uniformity. In this case, the larger the value, the higher the stability of the device. Even when the emitter finger length L is 30 μm or less, and the applied power is 5 dB, the HBT is not broken.

Further, in the structure of the bipolar transistor of this embodiment, since only one base finger is provided between the two emitter fingers, the number of base fingers per emitter finger is minimum. Therefore, an area of the base finger with respect to an emitter area corresponding to a required output power is small, so that an area of the base layer which is larger than the emitter area can be reduced. Therefore, the base mesa width W1 can be narrowed, so that a base-collector capacitance can be reduced, thereby making it possible to achieve a high gain in a radio frequency band.

Figure 4:
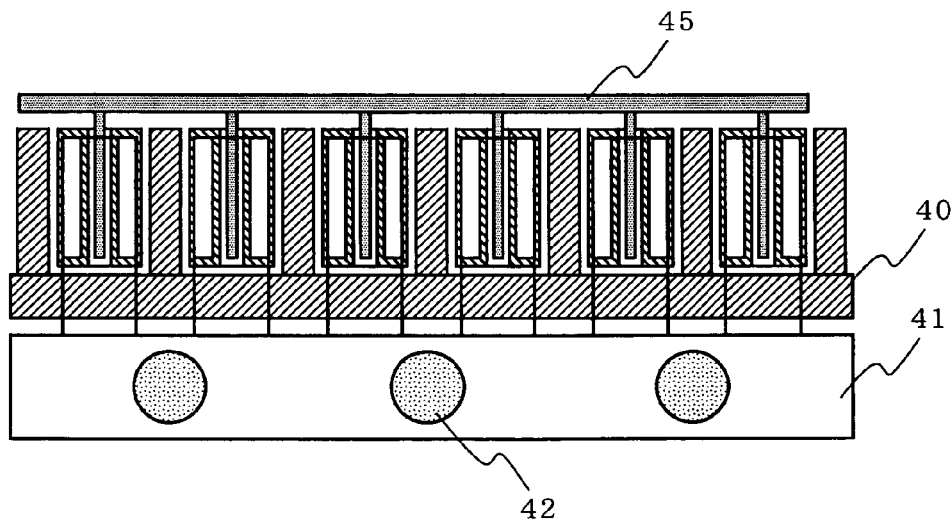
FIG. 4 is a diagram illustrating an exemplary configuration of a power-amplification HBT having a multi-cell structure where each cell is the bipolar transistor of FIG. 1A.
Figure 5:
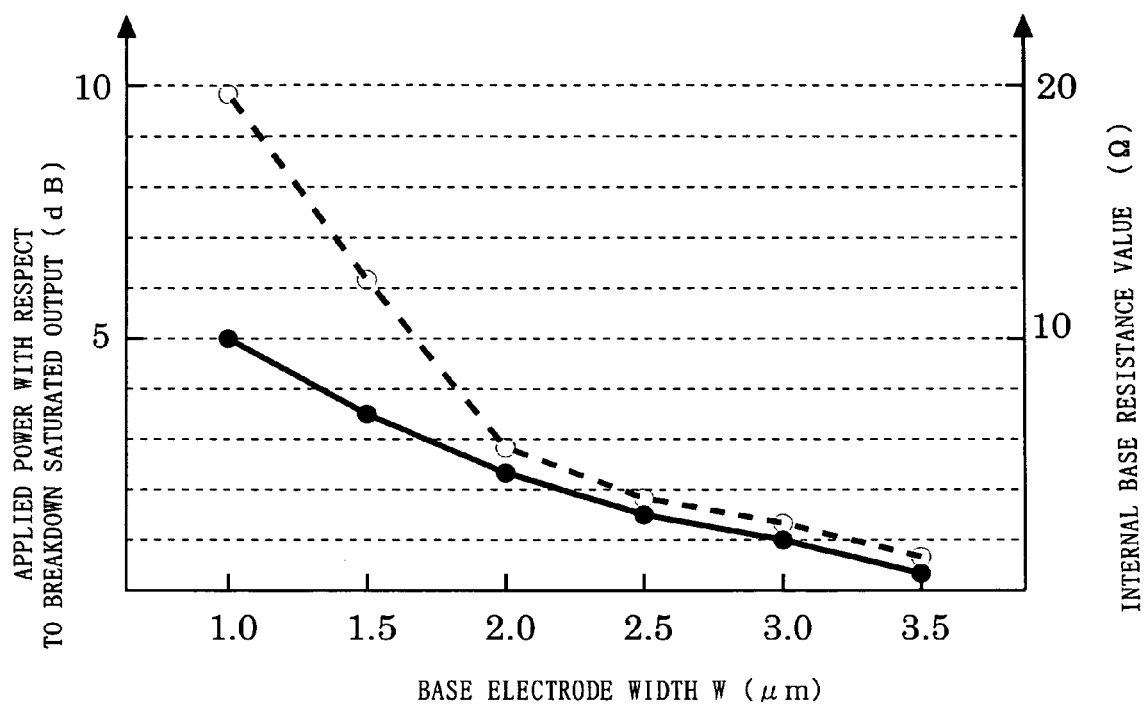
FIG. 5 is a characteristics diagram illustrating a correlation between a base electrode width (an internal base resistance value) and a breakdown withstanding property.

Here, if a width of the base electrode 12 is set to be 1 μm or less, a contact area of the base electrode 12 and the base layer 16 is small, so that the contact resistance is large. FIG. 4 illustrates an exemplary structure of a power-amplification HBT in which the bipolar transistor of the present invention is considered as one cell, and a plurality of cells are connected in parallel. FIG. 5 illustrates a characteristic correlation diagram of the base electrode width, a breakdown withstanding property, and a base-contact resistance, where the emitter finger length L of the HBT is 30 μm. As can be seen from FIG. 5, when the base electrode width is 1 μm or less, the transistor has a parasitic base resistance of as high as 20Ω, and the breakdown withstanding performance is high, so that a base ballast resistance for preventing thermal runaway is no longer required. Therefore, when a power-amplification HBT is configured to have a structure in which a bipolar transistor is considered as one cell and a plurality of cells are connected in parallel, an area of the configuration can be reduced by an amount corresponding to the external base resistance (base ballast resistance) 130 required for the conventional configuration (FIG. 11A, etc.).

Figure 6:
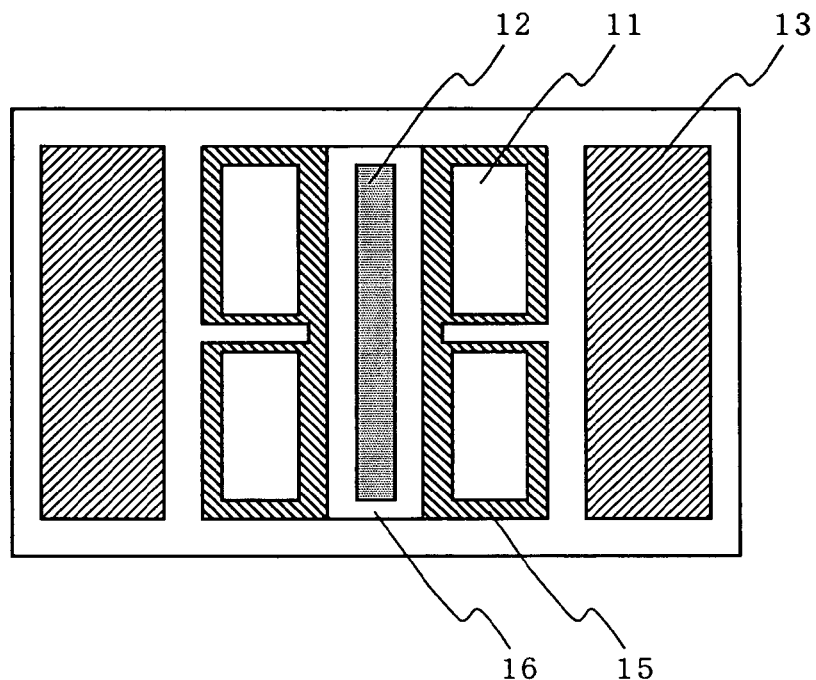
FIG. 6A is a plan view illustrating another bipolar transistor according to an embodiment of the present invention.
FIG. 6B is a diagram illustrating an exemplary configuration of a power-amplification HBT having a multi-cell structure where each cell is the bipolar transistor of FIG. 6A.
Figure 6:
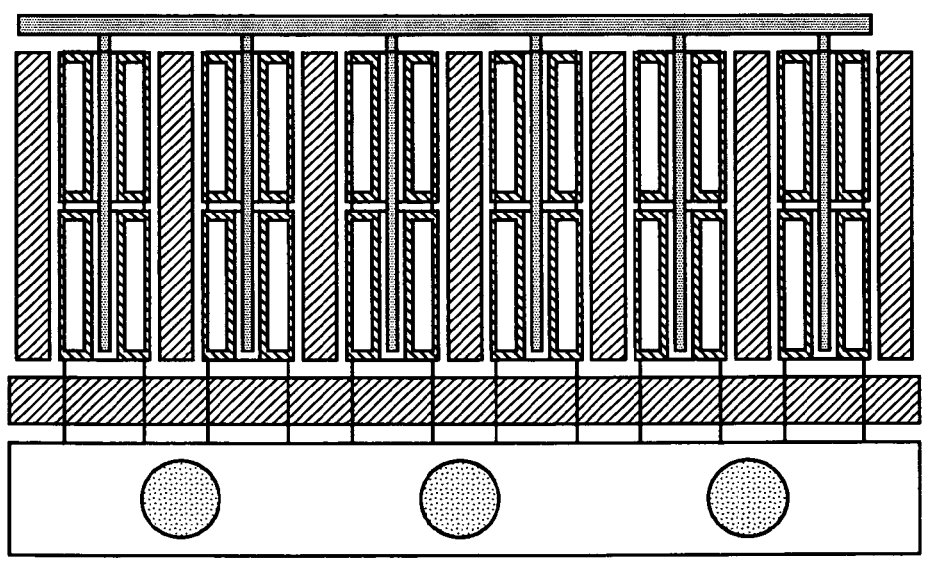

Note that, when a large number of cells are required to obtain high output characteristics of a power amplifier, HBT cells having a structure in which two or more base mesas are provided and the base electrode 12 and the collector electrode 13 are used in common, may be fabricated. FIG. 6A illustrates an exemplary structure of the bipolar transistor. Despite a long base finger length, one base mesa portion has a base resistance of about 20Ω, so that non-uniformity is suppressed in two base mesa portions in a new unit cell. According to the structure of the present invention, cells can be easily connected, and a new cell can be configured. FIG. 6B illustrates an exemplary configuration of a power-amplification HBT in which this bipolar transistor is considered as one cell and a plurality of cells are connected in parallel.

(Method for Fabricating Bipolar Transistor)

Next, a method for fabricating the bipolar transistor of the embodiment of the present invention will be described.

Figure 7:
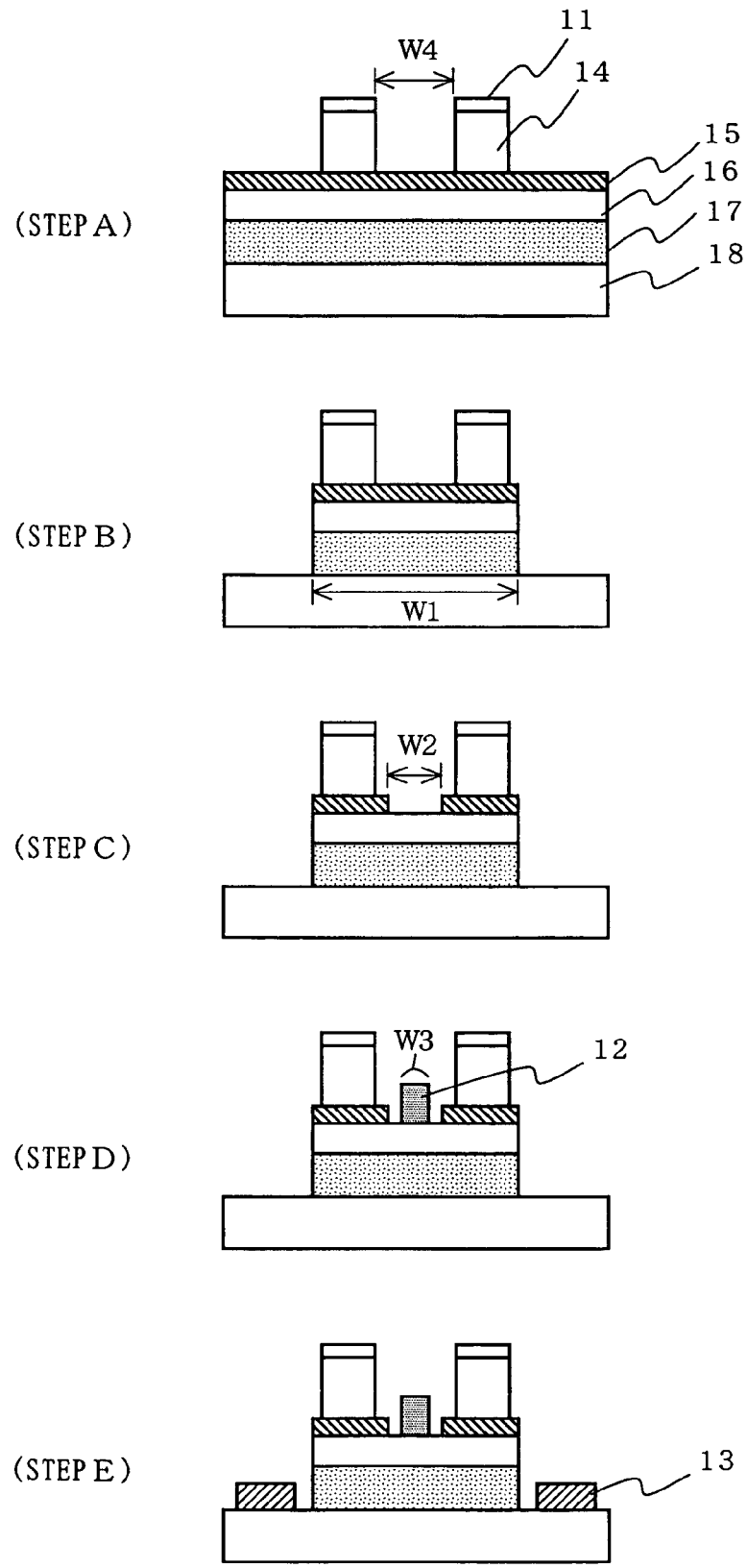
FIG. 7 is a diagram for describing steps of fabricating the bipolar transistor of the embodiment of the present invention of FIG. 1B.

FIG. 7 is a diagram for describing steps A to E of fabricating the bipolar transistor of the embodiment of the present invention of FIG. 1B.

An emitter portion is a layer including the n type GaAs emitter layer 14 and the n type InGaP emitter ledge layer 15. A layer which contacts the emitter electrode 11 made of WSi requires ohmic contact. Therefore, a thin layer of InGaAs is provided at an uppermost layer of the emitter. The p type GaAs base layer 16 (base portion) is provided under the emitter portion. The n type GaAs collector layer 17 is provided under the p type GaAs base layer 16. An n+ type GaAs sub-collector layer 18 (called sub-collector layer) which is doped at a high concentration is provided under the n type GaAs collector layer 17. This epitaxial layer is subjected to an etching process to form an emitter mesa layer and a base mesa layer, thereby forming three terminal electrodes of the transistor on the semiconductor layer. In this manner, the transistor is fabricated.

For the HBT, selective etching of GaAs and InGaP can be used in the etching step. The collector electrode 13 is made of an alloy of Ni/AuGe/Au, and the base electrode 12 is made of Ti/Pt/Au.

Initially, the n type GaAs emitter layer 14 is etched while masking the WSi emitter electrode 11 formed on an emitter region, to expose the n type InGaP emitter ledge layer 15 (step A). In this case, selective etching of GaAs and InGaP is used. Next, the n type InGaP emitter ledge layer 15, the p type GaAs base layer 16, and the n type GaAs collector layer 17 are etched to expose the n+ type GaAs sub-collector layer 18 (step B). The step B is a step of forming the base mesa layer. The smaller the base mesa width W1, the smaller the base-collector capacitance, i.e., the more excellent the radio frequency characteristics.

Here, a function of the heterojunction emitter ledge layer will be briefly described. A surface of the p type base layer exposed by etching and removing the emitter portion has a number of surface states, and surface recombination in the states causes crystal deterioration. To take measures against this problem, such large a base layer surface surrounding a required area of the emitter layer as possible is protected by depositing another stable layer (i.e., an emitter ledge layer). This structure employing the emitter ledge layer is also called a girdling structure.

The n type InGaP emitter ledge layer 15 is etched within an emitter mesa interval W4 to expose the p type GaAs base layer 16 (step C). This etching is selective etching, thereby forming an opening having a ledge opening width W2. When the high-precision narrow emitter ledge opening width W2 is formed in the narrow emitter mesa interval W4 to increase a radio frequency performance, a high-precision photolithography technique and a high-precision etching technique are required, i.e., a high-cost fabrication method is required.

Next, the base electrode 12 having a width of 1 μm or less and made of Ti/Pt/Au is formed using deposition lift-off (step D). Next, the collector electrode 13 made of AuGeNi/Au is formed on the n+ type GaAs sub-collector layer 18 using deposition lift-off, followed by heating at about 400° C. into an alloy (step E).

In the HBT having excellent radio frequency characteristics, in order to improve a function thereof in a radio frequency band, it is necessary to narrow the base mesa width W1, secure the ledge opening width W2 in the narrow base mesa width W1, and form a base electrode having a width of 1 μm or less. However, the fabrication cost is increased as described above.

Figure 8:
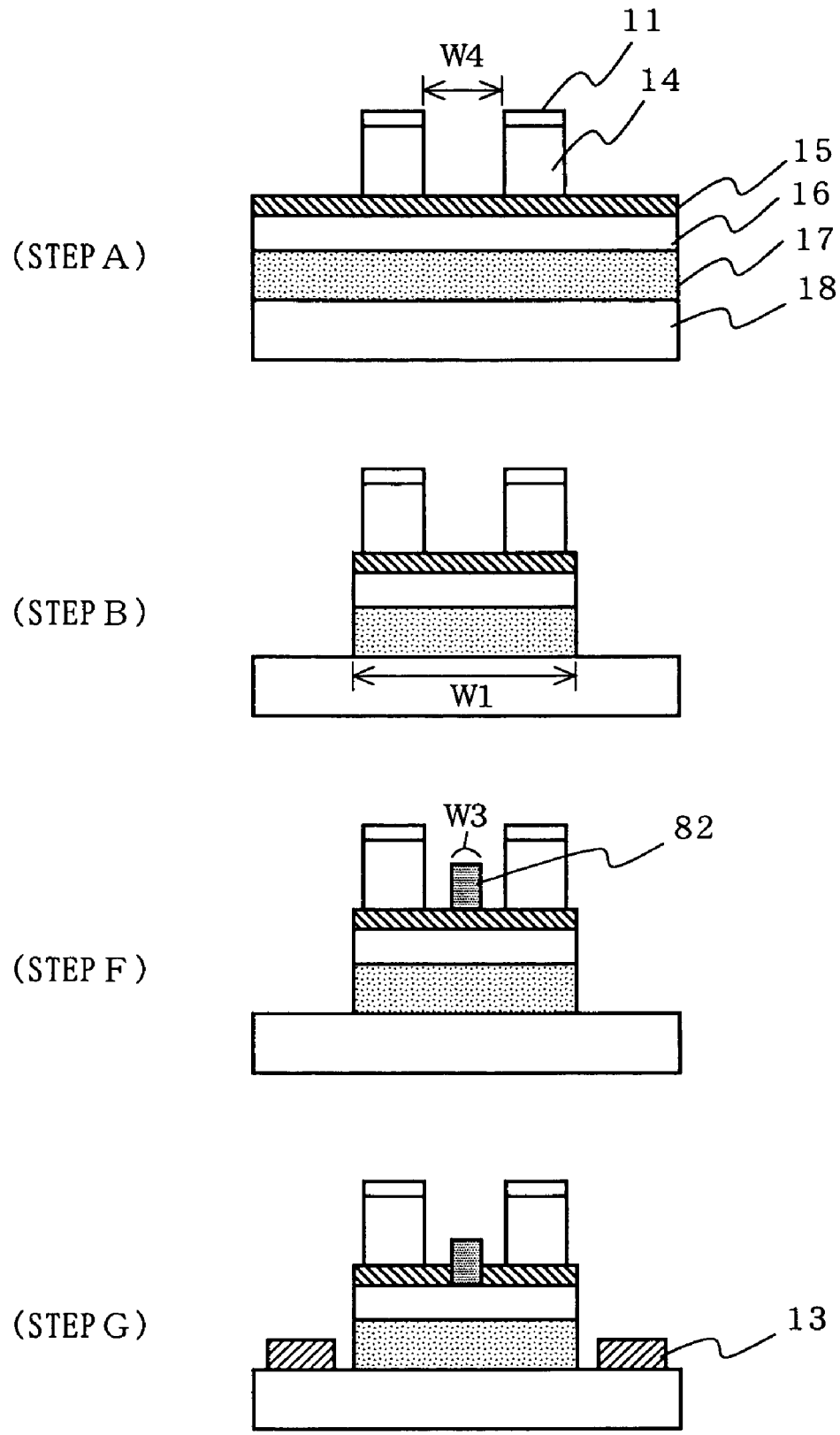
FIG. 8 is a diagram for describing other steps of fabricating a bipolar transistor obtained by modifying that of FIG. 1B.

Therefore, a simplified version of this fabrication method and an HBT structure fabricated with this simplified method are illustrated in FIG. 8. In the HBT structure of FIG. 8, a ledge opening is not originally provided, and a base electrode 82 penetrates through the n type InGaP emitter ledge layer 15 which is typically in a heterojunction with the p type GaAs base layer 16, to contact the p type GaAs base layer 16. In the HBT structure, a step of etching the n type InGaP emitter ledge layer 15 to form a small opening is not required, resulting in a simple fabrication method. After the base electrode 82 is deposited and formed on the n type InGaP emitter ledge layer 15, the base electrode 82 is thermally diffused into the n type InGaP emitter ledge layer 15 by heating, so that the base electrode 82 contacts the p type GaAs base layer 16. In this structure, a ledge opening width is not present, and the base width W3 is narrow, so that the base mesa width W1 can be caused to be smaller than that of any structure, and the base-collector capacitance is also small, resulting in an improvement in gain and efficiency and satisfactory radio frequency characteristics.

Note that the collector electrode 13 is made of an alloy of Ni/AuGe/Au, and the base electrode 82 is made of Pt/Ti/Pt/Au where Pt is introduced into a lowermost layer.

Initially, the n type GaAs emitter layer 14 is etched while masking the WSi emitter electrode 11 formed on the emitter region, to expose the n type InGaP emitter ledge layer 15 (step A). In this case, selective etching of GaAs and InGaP is used. Next, the n type InGaP emitter ledge layer 15, the p type GaAs base layer 16, and the n type GaAs collector layer 17 are etched to expose the n+ type GaAs sub-collector layer 18 (step B). The step B is a step of forming the base mesa layer. The smaller the base mesa width W1, the smaller the base-collector capacitance, i.e., the more excellent the radio frequency characteristics. Steps A and B are the same as those of FIG. 7.

After a base mesa is formed, the base electrode 82 made of Pt/Ti/Pt/Au is formed on n type InGaP emitter ledge layer 15 using deposition lift-off (step F). Thereafter, the collector electrode 13 made of AuGeNi/Au is formed using deposition lift-off, followed by heating at about 400° C. into an alloy to form the collector electrode 13 (step G). The heating at about 400° C. not only allows the collector electrode 13 to change into an alloy, but also causes Pt in the lowermost layer of the Pt/Ti/Pt/Au base electrode 82 on the n type InGaP emitter ledge layer 15 to be thermally diffused into the n type InGaP emitter ledge layer 15 (since Pt has a high thermal diffusion coefficient), to contact the p type GaAs base layer 16, resulting in an ohmic connection.

In this structure, the improvement of radio frequency performance does not require a high-performance fabrication method for forming the high-precision narrow emitter ledge opening width W2 in the narrow emitter mesa interval W4, resulting in low cost. In addition, since W1>W4>W3 is required, the emitter mesa interval W4 can be caused to be narrower for the same base width W3, and as a result, the base mesa width W1 can be narrowed. Thereby, the base-collector capacitance can be further reduced, thereby making it possible to improve performance in a radio frequency band.

(Configuration of Power Amplifier)

Next, a power amplifier employing the bipolar transistor of the embodiment of the present invention will be described.

Figure 9:
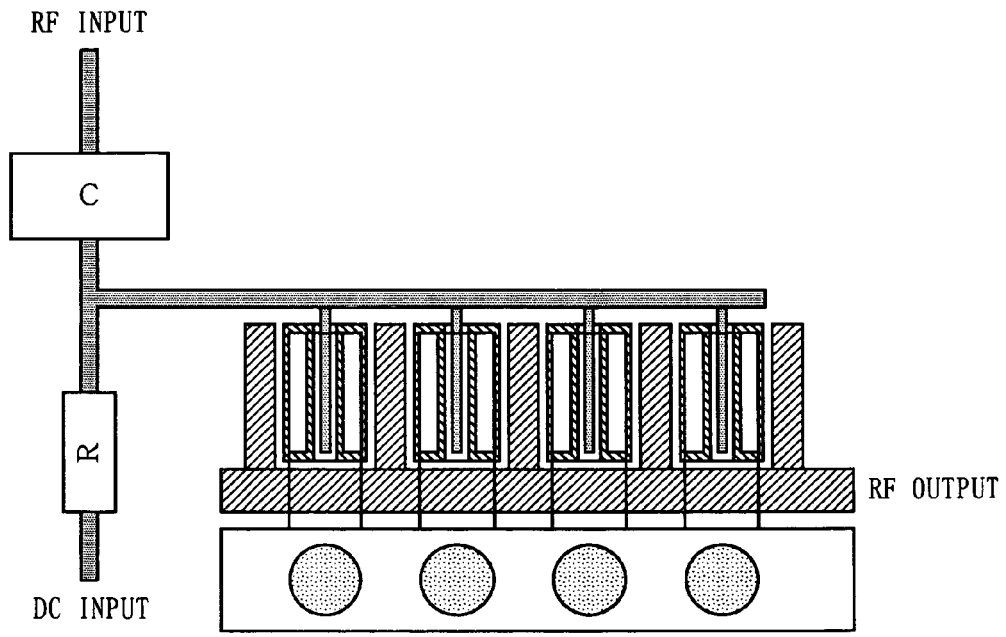
FIG. 9A is a diagram illustrating an exemplary configuration of a power amplifier in which a plurality of the bipolar transistors of the embodiment of the present invention are connected in parallel.
FIG. 9B is an equivalent circuit diagram illustrating the power amplifier of FIG. 9A.
Figure 9:
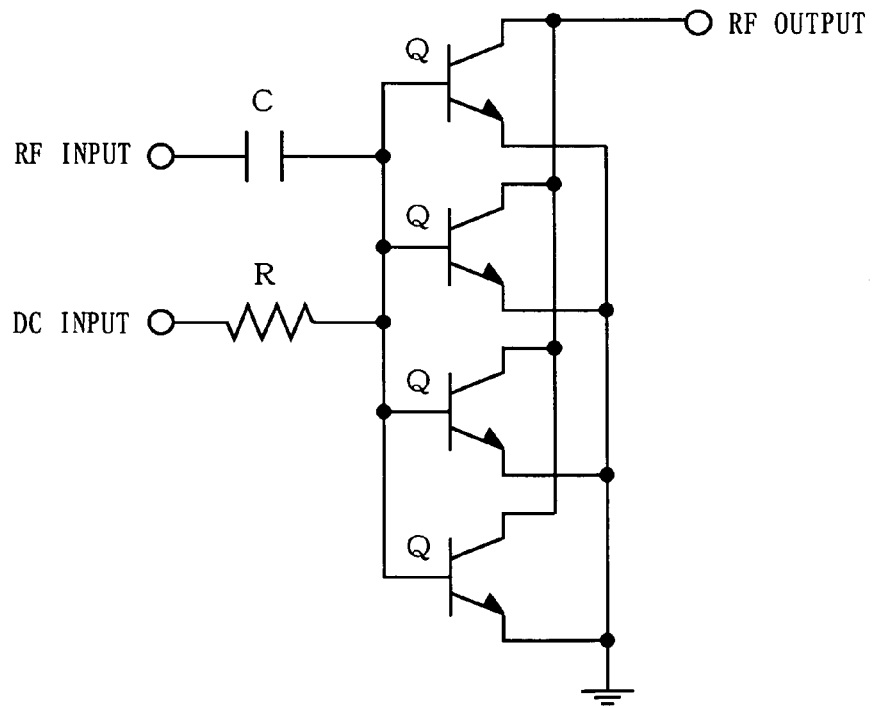
Figure 10A:
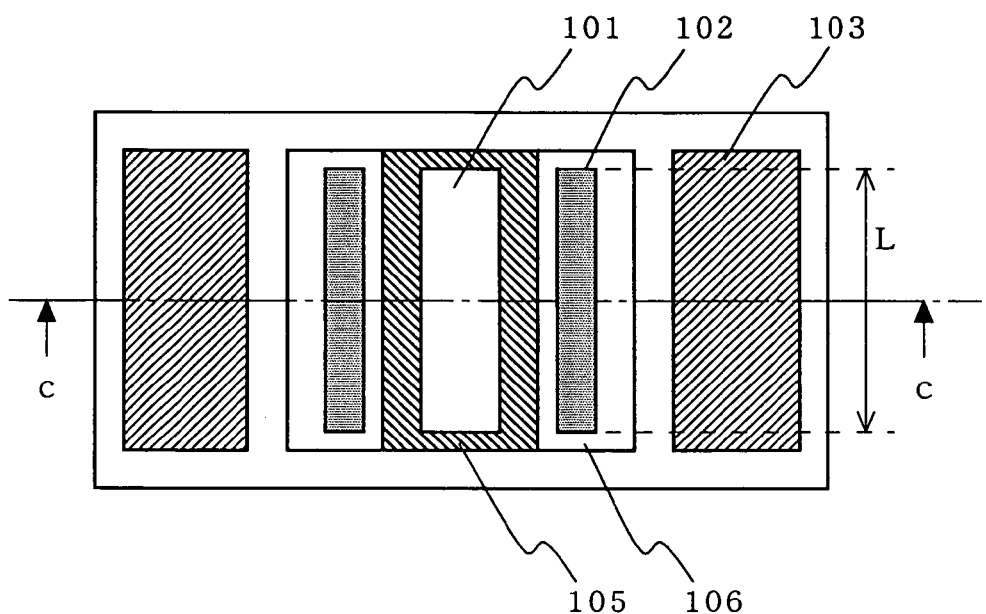
FIG. 10A is a plan view illustrating a structure of a conventional bipolar transistor.
Figure 10B:
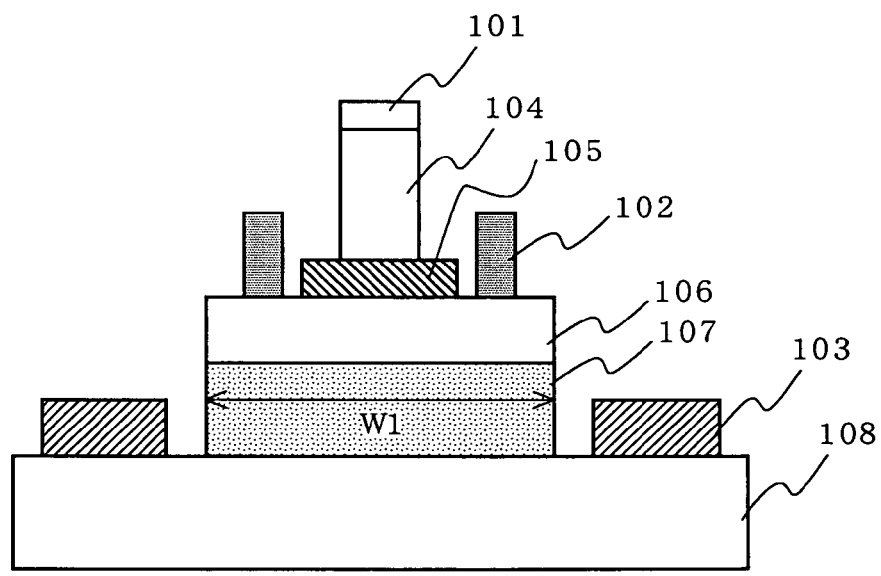
FIG. 10B is a cross-sectional view illustrating the bipolar transistor, taken along line c-c in FIG. 10A.
Figure 13:
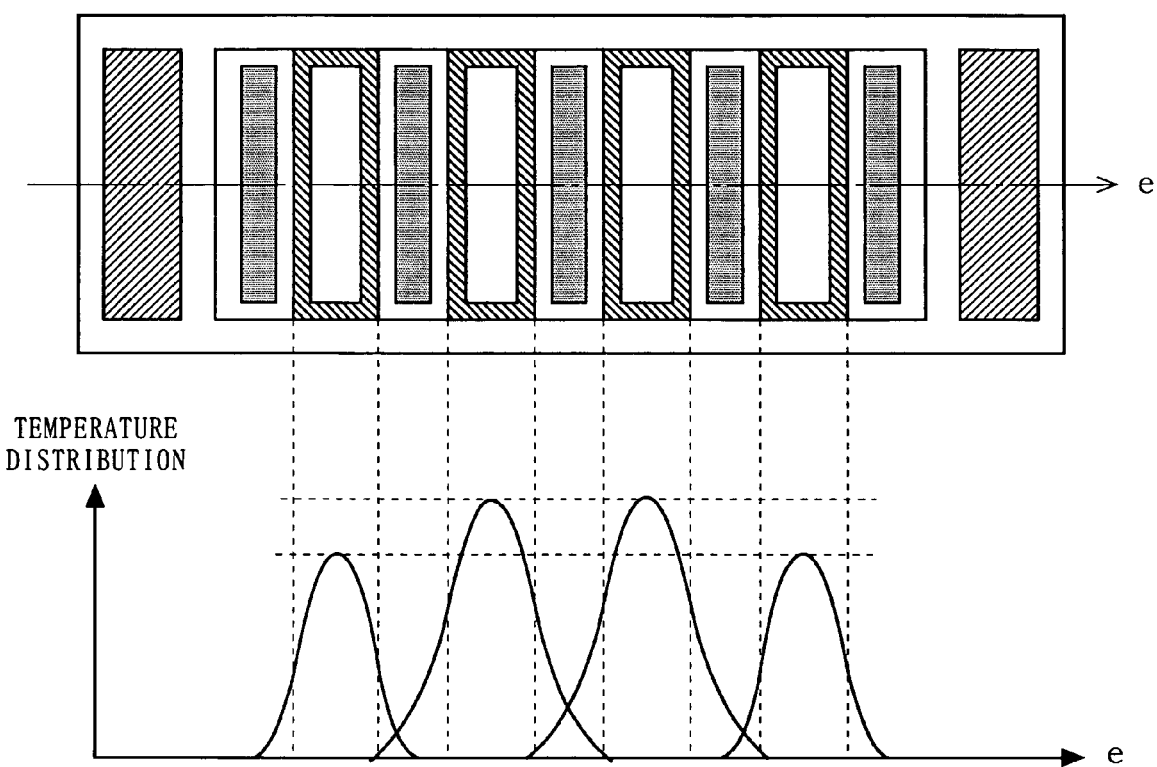
FIG. 13 is a diagram illustrating a unit cell temperature distribution of the bipolar transistor of FIG. 11A.

FIG. 9A is a diagram illustrating an exemplary configuration of a power amplifier in which a plurality of the bipolar transistors of the embodiment of the present invention of FIG. 1B are connected in parallel. FIG. 9B is an equivalent circuit diagram illustrating the power amplifier of FIG. 9A. In the exemplary configuration of the power amplifier of FIGS. 9A and 9B, four bipolar transistors are connected in parallel.

The power amplifier is composed of a plurality of bipolar transistors Q, a capacitance C, and a resistance R. The base electrodes of the plurality of bipolar transistors Q are connected in common via the capacitance C to a radio frequency signal input (RF input) terminal and via the resistance R to a bias supply (DC input) terminal. The capacitance C is a capacitance for passing a radio frequency signal. The resistance R is a suppression resistance for preventing an excessive amount of base current from flowing. The emitter electrodes of the plurality of bipolar transistors Q are grounded via a common conductor and a via hole. The collector electrodes of the plurality of bipolar transistors Q are connected in common to a radio frequency signal output (RF output) terminal.

Since the power amplifier has the structure in which a plurality of the bipolar transistors of FIG. 1B are connected in parallel, the base-collector capacitance is small, so that the gain and the efficiency are improved, resulting in satisfactory radio frequency characteristics. In addition, the breakdown withstanding property is high, so that a base ballast resistance for preventing thermal runaway is no longer required. In this case, therefore, when a power-amplification HBT in which a bipolar transistor is considered as one cell and a plurality of cells are connected in parallel is configured, the area of the configuration can be reduced by an amount corresponding to the external base resistance (base ballast resistance) 130 which is required for the conventional configuration (FIG. 11A, etc.).

As described above, according to the bipolar transistor of the embodiment of the present invention, there is an excellent uniform operation in a cell, and the base-collector capacitance can be reduced, thereby obtaining excellent radio frequency characteristics with low cost. In the case of a multi-cell power amplifier, a power amplifier having a small size (without an external base resistance) and an excellent breakdown withstanding property, can be achieved.

While the invention has been described in detail, the foregoing description is in all aspects illustrative and not restrictive. It is understood that numerous other modifications and variations can be devised without departing from the scope of the invention.

What is claimed is:

1. A heterojunction bipolar transistor which is formed on a semiconductor substrate and has an emitter layer which is in a heterojunction with a base layer, the heterojunction bipolar transistor comprising:
a base electrode;
two emitter electrodes disposed sandwiching the base electrode;
two emitter semiconductor layers disposed under the two emitter electrodes, respectively; and
two collector electrodes disposed sandwiching the base electrode and the two emitter semiconductor layers,
wherein the base electrode is incompletely surrounded by the two emitter semiconductor layers,
wherein a wire of the base electrode is led from a portion of the base electrode which is not surrounded by the two emitter semiconductor layers without passing on or above the two emitter semiconductor layers.

* * * * *